United States Patent
Schmied et al.

(10) Patent No.: US 6,456,108 B1
(45) Date of Patent: Sep. 24, 2002

(54) INPUT CIRCUIT FOR AN OUTPUT STAGE

(75) Inventors: Helmut Schmied, Marbach; Bernd Bireckoven, Kusterdingen; Hans Berkemer, Grossglattbach; Hartmut Michel, Reutlingen, all of (DE)

(73) Assignee: Robert Bosch GmbH (DE)

( * ) Notice: Subject to any disclaimer, the term of this patent is extended or adjusted under 35 U.S.C. 154(b) by 0 days.

(21) Appl. No.: 09/787,796

(22) PCT Filed: Jul. 1, 1999

(86) PCT No.: PCT/DE99/02023

§ 371 (c)(1),
(2), (4) Date: May 23, 2001

(87) PCT Pub. No.: WO00/18011

PCT Pub. Date: Mar. 30, 2000

(30) Foreign Application Priority Data

Sep. 23, 1998 (DE) .......................... 198 43 562
Oct. 21, 1998 (DE) .......................... 198 48 494

(51) Int. Cl.⁷ ..................... H03K 19/003; H03K 17/16
(52) U.S. Cl. ..................... 326/31; 326/30; 326/81; 326/89
(58) Field of Search ..................... 326/30, 31, 81, 326/89; 327/143, 198

(56) References Cited

U.S. PATENT DOCUMENTS

| | | | | |
|---|---|---|---|---|
| 4,254,347 A | * | 3/1981 | Ray ........................... | 327/143 |
| 4,398,098 A | | 8/1983 | Minchey ..................... | 307/140 |
| 4,481,430 A | * | 11/1984 | Houk et al. .................. | 327/540 |
| 4,697,103 A | * | 9/1987 | Ferris et al. .................. | 326/89 |
| 5,051,611 A | * | 9/1991 | Kantz ........................ | 327/143 |
| 5,313,112 A | * | 5/1994 | Macks ........................ | 327/143 |
| 5,565,807 A | * | 10/1996 | Ward ......................... | 327/205 |
| 5,617,048 A | | 4/1997 | Ward et al. .................. | 327/143 |

FOREIGN PATENT DOCUMENTS

WO WO 93 14569 7/1993

OTHER PUBLICATIONS

Power–On Circuit, IBM Technical Disclosure Bulletin, vol. 29, No. 5, Oct. 1986,, IBM Corp., New York, pp. 2167–2168.*

* cited by examiner

Primary Examiner—Michael G. Lee
Assistant Examiner—Steven S. Paik
(74) Attorney, Agent, or Firm—Kenyon & Kenyon

(57) ABSTRACT

Described is a control circuit for an output stage for suppressing electrical and electromagnetic interference having a signal input (I), a signal output (O), and a ground terminal, two switch stages (1; 2) which are connected to the signal input (I) and the ground and which have one control terminal and one output terminal each, each switch stage (1; 2) switching over from a first state in which the potential at the output terminal follows the potential at the signal input (I) to a second state in which the potential at the output terminal is drawn to ground when a first or second threshold value ($U_{in1}$, $U_{in2}$) is exceeded at its control terminal, the control terminal (4) of the first switch stage (1) being connected to an intermediary potential, which is between the potential at the signal input (I) and ground, the output terminal (5) of the first switch stage (1) forming the control terminal of the second switch stage (2), the output terminal of the second switch stage forming the signal output (O) of the control circuit, and the threshold value ($U_{in1}$) of the first switch stage being higher than the threshold value ($U_{in2}$) of the second switch stage.

6 Claims, 2 Drawing Sheets

INPUT CIRCUIT FOR AN OUTPUT STAGE

The present invention relates to an input circuit for an output stage which is inserted between a signal line and an output stage controlled by the signal in order to suppress spurious pulses which may be generated, for example, by electromagnetic induction phenomena in the signal line.

BACKGROUND INFORMATION

When output stages are controlled via an electric line having a non-negligible length, the problem always arises of distinguishing between "intentional control" and interference in the form of electromagnetic induction phenomena on the line, for example. In the first case, the output stage should receive a current from the line; in the second case it should preferably ignore the interference signal erroneously applied. This problem is known as "electromagnetic compatibility" (EMC). The desired electromagnetic compatibility can be achieved in principle by evaluating the different voltage levels applied to the output stage; intentional control signals usually have a fixed voltage range, which is above the limit value characterizing a given application. In contrast, signals caused by electromagnetic interference have a smaller voltage range which can be distinguished from one interference event to the other and is usually lower than the intended control signals. Thus, for example, in the case of an ignition output stage of a motor vehicle, "intended" control takes place with voltages higher than 3 V, whereas signals caused by electrical or electromagnetic interference on the control line of such an ignition output stage have typical values of up to 2 V. Although these voltages, which are lower than the setpoint value of 3 V, do not entirely activate the ignitor, the interference signal levels may be sufficient, especially at high temperatures, for allowing the flow of load currents greater than 0.1 A, so that an effect of the interference can be detected in the load circuit.

Various discrete input wirings of such an output stage are known for suppressing the interference signals; however they are expensive to manufacture due to their discrete design and require considerable space.

Comparators integrated on a single semiconductor substrate are also known which generate a discrete output signal whenever the level of an input signal applied exceeds a reference value. Such comparators may be connected upstream from an output stage in order to suppress all incoming pulses that do not exceed the reference value (in the above case of an ignition output stage, a reference voltage of 3 V, for example). These comparators, however, require a supply voltage and an externally supplied reference voltage in order to perform their function. Supplying this reference voltage from a certain distance is inconvenient because in this case the reference voltage supply lead is subject to interference in the same way as the control line. In contrast, if the reference voltage is generated directly in the control circuit, the complexity, manufacturing costs, and required space are increased again.

ADVANTAGES OF THE INVENTION

The control circuit for an output stage having the features specified in claim 1 offers the advantage compared to the related art in that it makes reliable suppression of interference signals possible without the need to provide a reference voltage; it operates without a supply voltage, and for its operation only requires components that are easy to integrate on a semiconductor substrate.

As long as no signal is applied to the signal input of the control circuit, both switch stages are in their first state. If the potential at the signal input increases due to an incoming signal, the potentials of both output terminals follow suit, so that initially a rising potential is also output by the signal output. With increasing potential at the signal input, the threshold value of the second switch stage is exceeded first, which switches over to its second state in which its output terminal is drawn to ground. Since this is also the signal output, no more signals are output; the pulse received at the signal input is suppressed. If the potential applied to the signal input continues to rise, the threshold value of the first switch stage is also exceeded, its output is drawn to ground, whereupon the second switch stage returns to its first state in which the potential at the output terminal becomes equal to that at the signal input. Thus an input signal which exceeds the threshold value of the first switch stage is output at the signal output, while lower-intensity signals are suppressed.

Each switch stage can be formed in a simple manner by a resistor and a transistor, the resistor being connected between the collector of the transistor and the signal input, and the emitter of the transistor being connected to ground.

The base of this first and/or second transistor can directly form the control terminal of the first and/or second switch stage, respectively; however, in the case of the first switch stage, a third transistor is preferably provided whose base forms the control terminal of the switch stage and whose emitter controls the base of the first transistor. Thus, a steeper increase in the potential at the base of the first transistor and thus sharper separation between input signals greater and smaller than the threshold value of the first switch stage are achieved.

A fourth transistor is preferably also provided as part of the second switch stage; the collector of this transistor is connected to the signal input, its emitter forms the output terminal of the second switch stage, and its base is controlled by the collector of the second transistor. This transistor is conductive between emitter and collector in the first state of the second switch stage, and in its second state it blocks the connection between the signal input and the signal output of the control circuit.

The emitter of the fourth transistor can be connected to ground via a resistor.

The second threshold voltage of the control circuit is the voltage above which small interference signals are effectively suppressed. Expediently, it should be as low as possible, preferably in the range of the semiconductor boundary layer junction voltage. The first threshold voltage can be selected essentially freely depending on the intended application of the control circuit; in the case of an application in conjunction with an ignition output stage of a motor vehicle, the first threshold voltage is preferably higher than 2 V.

DRAWINGS

Embodiments of the present invention are illustrated in the drawings and explained in detail below.

Figure 1:
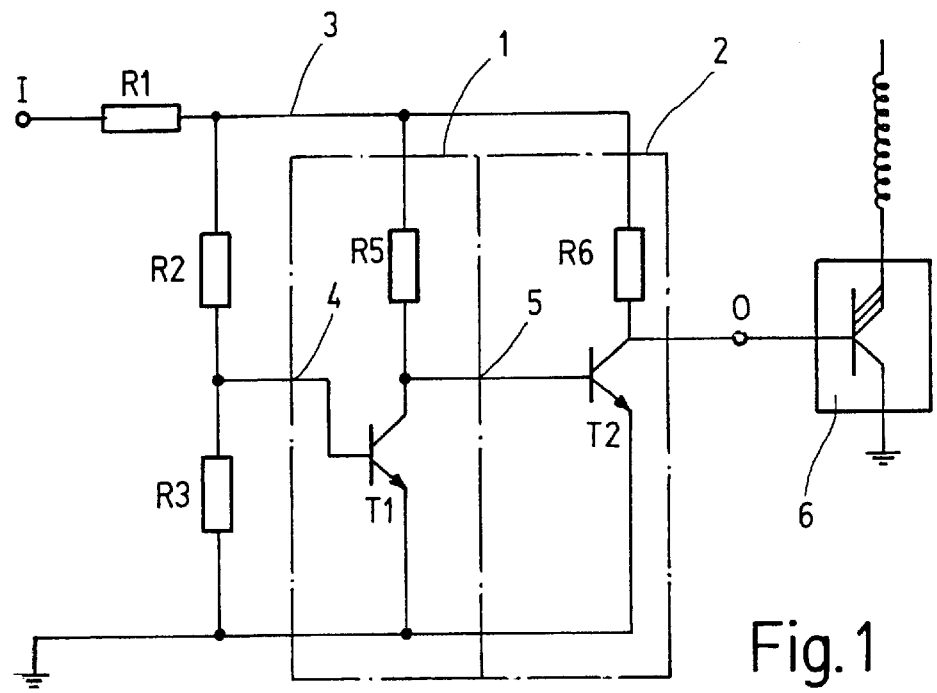
FIG. 1 shows a wiring diagram of a first embodiment of a control circuit according to the present invention.

The control circuit illustrated in FIG. 1 has three terminals, a signal input I, a signal output O, and a ground terminal. The signal input is connected to an input signal line 3 via a series resistor R1; a voltage divider composed of resistors R2, R3, a first switch stage 1, and a second switch stage 2 are connected to input signal line 3. The first switch stage has a transistor T1 whose collector is connected to input signal line 3 via a resistor R5; the base of transistor T1 forms a control terminal 4 of switch stage 1, which is connected to the mid-point of voltage divider R2, R3; the emitter of transistor T1 is connected to ground. An output terminal 5 of the first switch stage is directly connected to the collector of transistor T1.

Output terminal 5 is at the same time the input terminal of second switch stage 2 and is directly connected to the base of a second transistor T2, whose emitter is also connected to ground and whose collector is connected to input signal line 3 via a resistor R6, and directly connected to signal output O.

When the potential on input signal line 3 begins to rise due to a signal received at input I, initially a current flows into signal output O via resistor R6. As long as the potential at terminal 5 is lower than the semiconductor boundary layer junction voltage, transistor T2 is non-conducting and the current output by signal output O increases with the input signal. Since terminal 5 is connected to input signal line 3 via resistor R5, the potential also increases at this terminal and as soon as it has exceeded the boundary layer voltage, transistor T2 becomes conductive and the current at signal output O drops to a low value which depends on the collector-emitter resistance of transistor T2 and the internal resistance of the output stage connected downstream from signal output O.

If the potential on the input signal line continues to increase, the potential at control terminal 4 also attains a value at which transistor TI becomes conductive. Thereupon the potential at terminal 5 drops again, transistor 1 blocks, so that the entire current flowing through resistor R6 reaches the output stage via signal output O.

Figure 2:
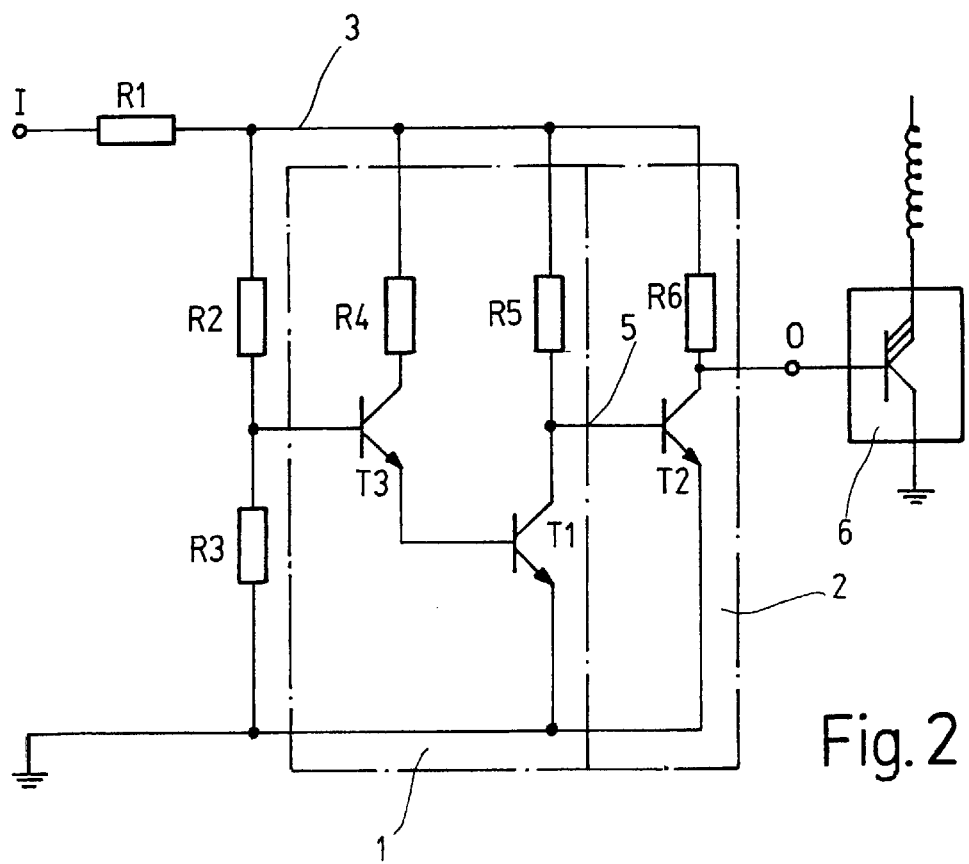
FIG. 2 shows a wiring diagram of an improved embodiment.

FIG. 2 shows an improved embodiment of the control circuit according to the present invention which differs from the one described with reference to FIG. 1 by the design of first switch stage 1. First switch stage 1 contains a third transistor T3, whose base is connected to the mid-point of voltage divider R2, R3, whose collector is connected to input signal line 3 via a resistor R4 and whose emitter is directly connected to the base of transistor T1.

Figure 3:
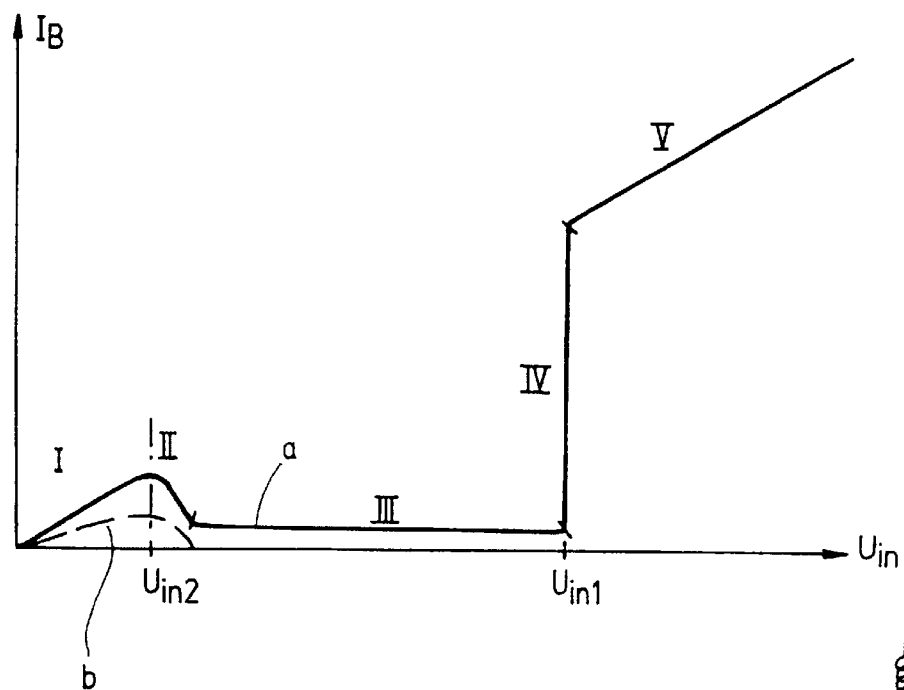
FIG. 3 shows a current/voltage characteristic of the embodiment of FIG. 2.

The behavior of this control circuit is shown in FIG. 2. FIG. 3 shows a current/voltage diagram where output current $I_B$ at signal output O is plotted against input voltage $U_{in}$ at signal input I. The characteristic curve of the circuit from FIG. 2, denoted by the symbol "a" has five phases, which are denoted by I to V. In the first phase which corresponds to very low input signals, input voltage $U_{in}$ and output current $I_B$ are linearly proportional. In the second phase II, the output current decreases with increasing input voltage. This phase corresponds to the transition of second switch stage 2 from its first state to its second state. In phase III, the second switch stage is in its second state in which transistor T2 is conductive, so that the input signal is essentially removed to ground via this transistor and no longer reaches signal output O. Output current $I_B$ is therefore small.

Phase IV corresponds to the transition of the first switch stage from the first to the second state. This phase extends over a voltage range that has a negligible width compared to phase II. This is achieved through the use of transistor T3, which prevents the potential applied to the base of transistor T1 from continuing to increase linearly with input potential $U_{in}$ as is the case in the embodiment according to FIG. 1, instead, for low input voltages, keeping this base potential constant at a low value at which transistor T1 is non-conductive and, as soon as it becomes conductive at higher input voltages, generating a rapid increase in the base potential of transistor T1, which allows transistor T1 to suddenly switch over from the nonconductive to the conductive state.

The switchover of transistor T1 results in the potential at terminal 5 returning to a low value, which results in transistor T2 of second switch stage 2 becoming non-conductive just as in phase I. Consequently, in phase V, output current $I_B$ is linearly proportional to input voltage $U_{in}$ again as in phase I.

Figure 4:
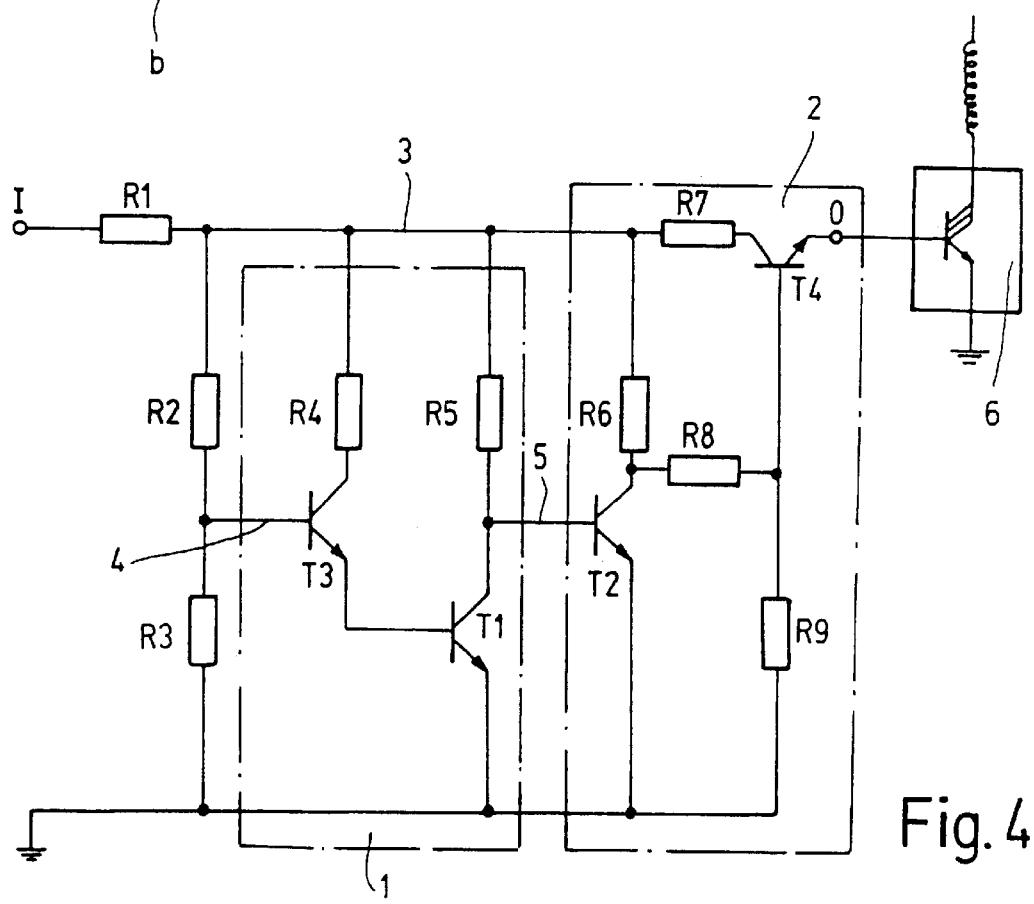
FIG. 4 shows a wiring diagram of a further refined embodiment.

FIG. 4 shows a further improved embodiment of the control circuit. It differs from the one illustrated in FIG. 2 by the fact that second switch stage 2 contains an additional transistor D4, whose collector is connected to input signal line 3 via a resistor R7; the base of this transistor is connected to the collector of transistor T2 via a resistor R8, and its emitter forms signal output O of the control circuit. This embodiment has the characteristic curve denoted by "b" in FIG. 3.

Transistor T4 is non-conductive between the collector and the emitter as long as input voltage $U_{in}$ does not exceed the semiconductor boundary layer junction voltage. This state corresponds to phase I of curve b in FIG. 3. The potential at the base of transistor T4 also increases via resistors R6 and R8 with increasing input voltage, so that this transistor can become at least partially conductive. In any case, it causes the output current to be suppressed in phases I and II of curve b in comparison with the embodiment described with reference to FIG. 2.

In phase III, transistor T2 is conductive as in the previously described embodiments. Consequently, the base potential of transistor T4 is low, it blocks, and $I_B$ is practically equal to zero. In phase V, however, the potential at the base of transistor T4 is sufficiently high to make it completely conductive, so that the behavior of the circuit shown in FIG. 4 in this phase does not substantially differ from that of the circuit of FIG. 2. Curves a and b in FIG. 3 are therefore almost identical in phases IV and V.

The above-described circuits are composed exclusively of resistors and capacitors which can be easily integrated on a common semiconductor substrate.

The behavior of the transistors, i.e., threshold voltages $U_{in1}$, $U_{in2}$ of the first and second switch stages may depend on the temperature. This is not important in practice for threshold voltage $U_{in2}$, of second switch stage 2. In contrast, temperature-dependence of threshold voltage $U_{in1}$ of first switch stage 1 is undesirable. It can, however, be easily suppressed by compensating the negative temperature coefficients of the base/emitter voltages of transistors T1 and T3 by using integrated resistors R2, R3 having different temperature coefficients, the following applying to the temperature coefficients TK: TK(R2)>TK(R3).

This ensures control of the output stage that is completely unaffected by the input circuit for input voltages higher than threshold voltage $U_{in1}$ of first switch stage 1 and effective protection against electrical and electromagnetic interference.

What is claimed is:
1. An input circuit for an output stage for suppressing electrical interference and electromagnetic interference in a control signal, comprising:
   a signal input connected to a signal line carrying the control signal;

a signal output connected to the output stage;
a ground terminal;
a first switch stage including a first control terminal, a first signal terminal, and a first output terminal, the first switch stage further including a first resistor, a first transistor, and a third transistor, the first resistor being connected between a collector of the first transistor and the first signal terminal, an emitter of the first transistor being connected to ground, a base of the third transistor forming the first control terminal of the first switch stage, and an emitter of the third transistor controlling a base of the first transistor;
a voltage divider, wherein:
   the first control terminal is connected to the voltage divider between a potential at the signal input and the ground terminal, and
   the first signal terminal is connected to the signal line; and
a second switch stage including a second control terminal, a second signal terminal, and a second output terminal, the second switch stage further including a second resistor and a second transistor, the second resistor being connected between a collector of the second transistor and the second signal terminal, and an emitter of the second transistor being connected to ground, wherein:
   the second control terminal is connected to the first output terminal of the first switch stage,
   the second signal terminal is connected to the signal line,
   the second output terminal is connected to the signal output,
   when a first threshold value is exceeded, the first switch stage switches over from a first state in which a potential at the first output terminal follows the potential at the signal input to a second state in which the potential at the first output terminal is drawn to ground,
   when a second threshold value is exceeded, the second switch stage switches over from the first state in which a potential at the second output terminal follows the potential at the signal input to the second state in which the potential at the second output terminal is drawn to ground, and
   the first threshold value is higher than the second threshold value.

2. The input circuit according to claim 1, wherein:
the voltage divider includes a plurality of resistors having different temperature coefficients.

3. The input circuit according to claim 1, wherein:
the second threshold value corresponds to a second threshold voltage that is in a range of a semiconductor boundary layer junction voltage, and
the first threshold value corresponds to a first threshold voltage that is greater than 2 V.

4. The input circuit according to claim 1, wherein:
the input circuit is monolithically integrated.

5. An input circuit for an output stage for suppressing electrical interference and electromagnetic interference in a control signal, comprising:
a signal input connected to a signal line carrying the control signal;
a signal output connected to the output stage;
a ground terminal;
a first switch stage including a first control terminal, a first signal terminal, and a first output terminal;
a voltage divider, wherein:
   the first control terminal is connected to the voltage divider between a potential at the signal input and the ground terminal, and
   the first signal terminal is connected to the signal line; and
a second switch stage including a second control terminal, a second signal terminal, and a second output terminal, wherein:
   the second control terminal is connected to the first output terminal of the first switch stage,
   the second signal terminal is connected to the signal line,
   the second output terminal is connected to the signal output,
   when a first threshold value is exceeded, the first switch stage switches over from a first state in which a potential at the first output terminal follows the potential at the signal input to a second state in which the potential at the first output terminal is drawn to ground,
   when a second threshold value is exceeded, the second switch stage switches over from the first state in which a potential at the second output terminal follows the potential at the signal input to the second state in which the potential at the second output terminal is drawn to ground,
   the first threshold value is higher than the second threshold value,
   the first switch stage includes a first resistor and a first transistor,
   the first resistor is connected between a collector of the first transistor and the first signal terminal,
   an emitter of the first transistor is connected to ground,
   the second switch stage includes a second resistor and a second transistor,
   the second resistor is connected between a collector of the second transistor and the second signal terminal,
   an emitter of the second transistor is connected directly to ground,
   the second switch stage includes a fourth transistor,
   a collector of the fourth transistor is connected to the second signal terminal of the second switch stage,
   a base of the fourth transistor is controlled by the collector of the second transistor, and
   an emitter of the fourth transistor forms the second output terminal of the second switch stage.

6. An input circuit for an output stage for suppressing electrical interference and electromagnetic interference in a control signal, comprising:
a signal input connected to a signal line carrying the control signal;
a signal output connected to the output stage;
a ground terminal;
a first switch stage including a first control terminal, a first signal terminal, and a first output terminal;
a voltage divider, wherein:
   the first control terminal is connected to the voltage divider between a potential at the signal input and the ground terminal, and
   the first signal terminal is connected to the signal line; and
a second switch stage including a second control terminal, a second signal terminal, and a second output terminal, wherein:
   the second control terminal is connected to the first output terminal of the first switch stage, the second signal terminal is connected to the signal line, the second output terminal is connected to the signal output, when a first threshold value is exceeded, the first switch stage switches over from a first state in which a potential at the first output terminal follows the potential at the signal input to a second state in which the potential at the first output terminal is drawn to ground, when a second threshold value is exceeded, the second switch stage switches over from the first state in which a potential at the second output terminal follows the potential at the signal input to the second state in which the potential at the second output terminal is drawn to ground, the first threshold value is higher than the second threshold value, the first switch stage includes a first resistor and a first transistor, the first resistor is connected between a collector of the first transistor and the first signal terminal, an emitter of the first transistor is connected to ground, the second switch stage includes a second resistor and a second transistor, the second resistor is connected between a collector of the second transistor and the second signal terminal, an emitter of the second transistor is connected to ground, the second switch stage includes a fourth transistor and a third resistor connected between the base of the fourth transistor and ground, a collector of the fourth transistor is connected to the second signal terminal of the second switch stage, a base of the fourth transistor is controlled by the collector of the second transistor, and an emitter of the fourth transistor forms the second output terminal of the second switch stage.

* * * * *

UNITED STATES PATENT AND TRADEMARK OFFICE
CERTIFICATE OF CORRECTION

PATENT NO. : 6,456,108 B1
DATED : September 24, 2002
INVENTOR(S) : Schmied et al.

It is certified that error appears in the above-identified patent and that said Letters Patent is hereby corrected as shown below:

Title page,
Item [57], ABSTRACT, delete "(I), (O), (1;2), (I), (1;2),(I), ($U_{in1}$, $U_{in2}$), (4), (1), (I), (5), (1), (2), (O), ($U_{in1}$), ($U_{in2}$);

Column 1,
Line 58, change "ADVANTAGES" to -- SUMMARY --;

Column 3,
Line 35, change "1" to -- T1 --;

Column 4,
Line 18, change "D4" to -- T4 --.

Signed and Sealed this

Twenty-eighth Day of October, 2003

JAMES E. ROGAN
*Director of the United States Patent and Trademark Office*